(12) United States Patent
Kim et al.

(10) Patent No.: US 11,600,804 B2
(45) Date of Patent: Mar. 7, 2023

(54) DISPLAY PANEL INCLUDING A CAPPING LAYER

(71) Applicant: Samsung Display Co., Ltd., Yongin-si (KR)

(72) Inventors: Jeongki Kim, Hwaseong-si (KR); Jong-Hoon Kim, Seoul (KR); Jaeheon Ahn, Hwaseong-si (KR); YeoGeon Yoon, Suwon-si (KR); Myoungjong Lee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 294 days.

(21) Appl. No.: 16/878,396

(22) Filed: May 19, 2020

(65) Prior Publication Data
US 2020/0381670 A1 Dec. 3, 2020

(30) Foreign Application Priority Data
May 27, 2019 (KR) .......................... 10-2019-0061836

(51) Int. Cl.
*H01L 51/52* (2006.01)
*H01L 27/32* (2006.01)
*G09G 3/20* (2006.01)

(52) U.S. Cl.
CPC ........ *H01L 51/5284* (2013.01); *H01L 27/322* (2013.01); *H01L 27/3244* (2013.01); *G09G 3/20* (2013.01); *G09G 2310/0272* (2013.01)

(58) Field of Classification Search
USPC .......................................................... 257/40
See application file for complete search history.

(56) References Cited

U.S. PATENT DOCUMENTS

| | | | |
|---|---|---|---|
| 2012/0267651 A1* | 10/2012 | Kim | H01L 51/56 257/89 |
| 2017/0076678 A1* | 3/2017 | Lee | G02F 1/1336 |
| 2018/0088404 A1* | 3/2018 | Chae | H01L 27/322 |
| 2018/0101056 A1* | 4/2018 | Lee | G02F 1/133617 |
| 2020/0266253 A1 | 8/2020 | Kim et al. | |
| 2021/0013455 A1* | 1/2021 | Bae | H01L 51/5271 |

FOREIGN PATENT DOCUMENTS

| KR | 10-2015-0117414 A | 10/2015 |
| KR | 10-2015-0125207 A | 11/2015 |
| KR | 10-2018-0039218 A | 4/2018 |
| KR | 10-2020-0100910 A | 8/2020 |

\* cited by examiner

*Primary Examiner* — Nduka E Ojeh
(74) *Attorney, Agent, or Firm* — Lewis Roca Rothgerber Christie LLP

(57) ABSTRACT

The display panel includes an upper display substrate including a display area and a non-display area adjacent to the display area and a lower display substrate that faces the upper display substrate to emit first color light, the lower display substrate including a plurality of display elements respectively overlapping the pixel areas. The display area includes a plurality of pixel areas and a light blocking area adjacent to the pixel areas. The upper display substrate includes a base substrate, a first light control layer on the base substrate to control the first color light, a capping layer including an absorption part overlapping the display area and on the first light control layer and a barrier part overlapping the light blocking area and protruding from the absorption part in a thickness direction of the base substrate, and a second light control layer on the barrier part.

20 Claims, 14 Drawing Sheets

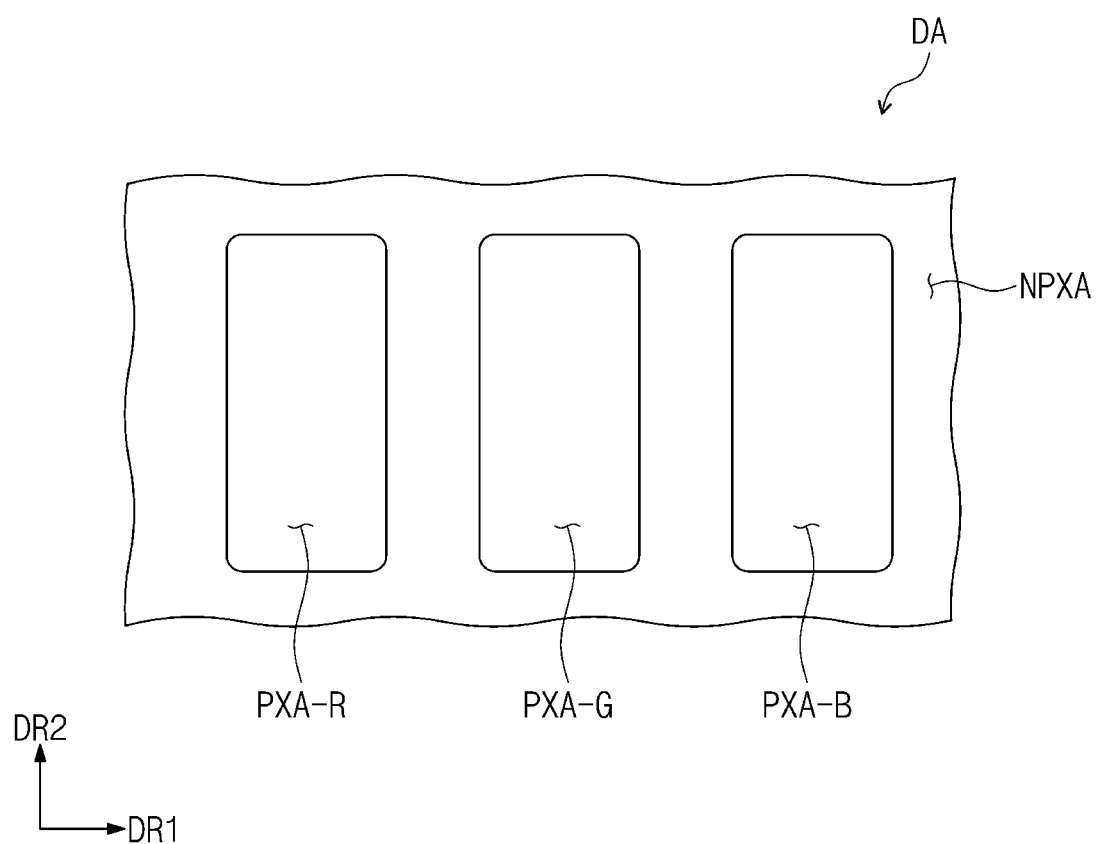

DISPLAY PANEL INCLUDING A CAPPING LAYER

CROSS-REFERENCE TO RELATED APPLICATION

This application claims priority to and the benefit of Korean Patent Application No. 10-2019-0061836, filed on May 27, 2019, the entire contents of which are incorporated herein by reference.

BACKGROUND

1. Field

Embodiments of the present disclosure herein relate to a display device, and, for example, to a display panel including a light conversion layer.

2. Description of the Related Art

Various display devices used in multimedia equipment such as televisions, mobile phones, table computers, navigation devices, and game consoles are being developed. A display device includes a transmissive display panel that selectively transmits source light generated from a light source and an emission type display panel that generates source light in the display panel itself.

The display panel includes a light conversion layer that receives light emitted from a light source to modify characteristics of the received light. A gas may be generated from a chamber that generates high heat or the light conversion layer under high-temperature high-humidity environments.

SUMMARY

The present disclosure provides a display panel including a capping layer that prevents or reduces the permeation of a gas into an internal space between two display substrates, the gas having been generated from a light conversion layer.

An embodiment of the present disclosure may be a display panel including: an upper display substrate including a display area and a non-display area adjacent to the display area, wherein the display area includes a plurality of pixel areas and a light blocking area adjacent to the pixel areas; and a lower display substrate that faces the upper display substrate to emit first color light, the lower display substrate including a plurality of display elements respectively overlapping the pixel areas, wherein the upper display substrate includes: a base substrate; a first light control layer on the base substrate to control the first color light; a capping layer including an absorption part overlapping the display area and being on the first light control layer and a barrier part overlapping the light blocking area and protruding from the absorption part in a thickness direction of the base substrate; and a second light control layer on the barrier part.

In an embodiment, the display panel may further include a sub capping layer between the first light control layer and the capping layer, wherein the sub capping layer entirely covers the first light control layer.

In an embodiment, the capping layer may be directly on the sub capping layer.

In an embodiment, the sub capping layer may include an inorganic material, and the capping layer may include an organic material.

In an embodiment, the absorption part may have a thickness greater than that of the sub capping layer in the thickness direction.

In an embodiment, the pixel areas may include first to third pixel areas that are arranged in one direction, and the first light control layer may include: a first conversion part overlapping the first pixel area and configured to convert the first color light so as to emit second color light; a second conversion part overlapping the second pixel area and configured to convert the first color light so as to emit third color light different from the second color light; and a transmission part overlapping the third pixel area and configured to transmit the first color light.

In an embodiment, the absorption part may include: a first absorption part overlapping the light blocking area and being between the first conversion part and the second conversion part, between the second conversion part and the transmission part, and between the first conversion part and the transmission part; and a second absorption part overlapping the display area, the second absorption part being configured to cover the first absorption part and being on the first light control layer, wherein the barrier part may protrude from the second absorption part.

In an embodiment, the barrier part may have a thickness greater than that of the second absorption part in the thickness direction.

In an embodiment, the barrier part may be spaced a predetermined distance from the lower display substrate.

In an embodiment, the second light control layer may be a reflection layer including a metal material configured to reflect the first color light.

In an embodiment, the reflection layer may be on an entire outer surface of the barrier part.

In an embodiment, the barrier part may include first and second outer surfaces facing each other and connected to the absorption part and a bottom surface configured to connect the first outer surface to the second outer surface, and the reflection layer may be on the first outer surface and the second outer surface.

In an embodiment, the bottom surface of the barrier part may be exposed from the second light control layer to face the lower display substrate.

In an embodiment, at least a portion of the second light control layer may contact the lower display substrate.

In an embodiment, the lower display substrate may include: a lower base substrate; a display element layer on the lower base substrate and including the display elements; and a cover layer configured to cover the display element layer, wherein the second light control layer may contact the cover layer.

In an embodiment, the second light control layer may be a light blocking layer configured to absorb the first color light.

In an embodiment, the light blocking layer may be on an entire outer surface of the barrier part.

In an embodiment, the display panel may further include a color filter layer between the base substrate and the first light control layer.

In an embodiment, the pixel areas may include first to third pixel areas that are arranged in one direction, and the color filter layer may include: a first color filter overlapping the first pixel area and configured to transmit second color light different from the first color light; a second color filter overlapping the second pixel area and configured to transmit third color light different from the second color light; and a third color filter overlapping the third pixel area and configured to transmit the first color light, wherein the third color filter may include a filter portion overlapping the third pixel area and a light blocking portion overlapping the light blocking area.

In an embodiment, the display panel may further include an adhesion member overlapping the non-display area and between the upper display substrate and the lower display substrate to define an inner space together with the upper display substrate and the lower display substrate, wherein the display panel may further include a filler in the inner space.

BRIEF DESCRIPTION OF THE FIGURES

The accompanying drawings are included to provide a further understanding of embodiments of the present disclosure, and are incorporated in and constitute a part of this specification. The drawings illustrate exemplary embodiments of the present disclosure and, together with the description, serve to explain principles of some embodiments of the present disclosure. In the drawings:

FIG. 4A is a plan view illustrating pixel areas of a display area of the display panel according to an embodiment of the present disclosure;

DETAILED DESCRIPTION

Figure 1:
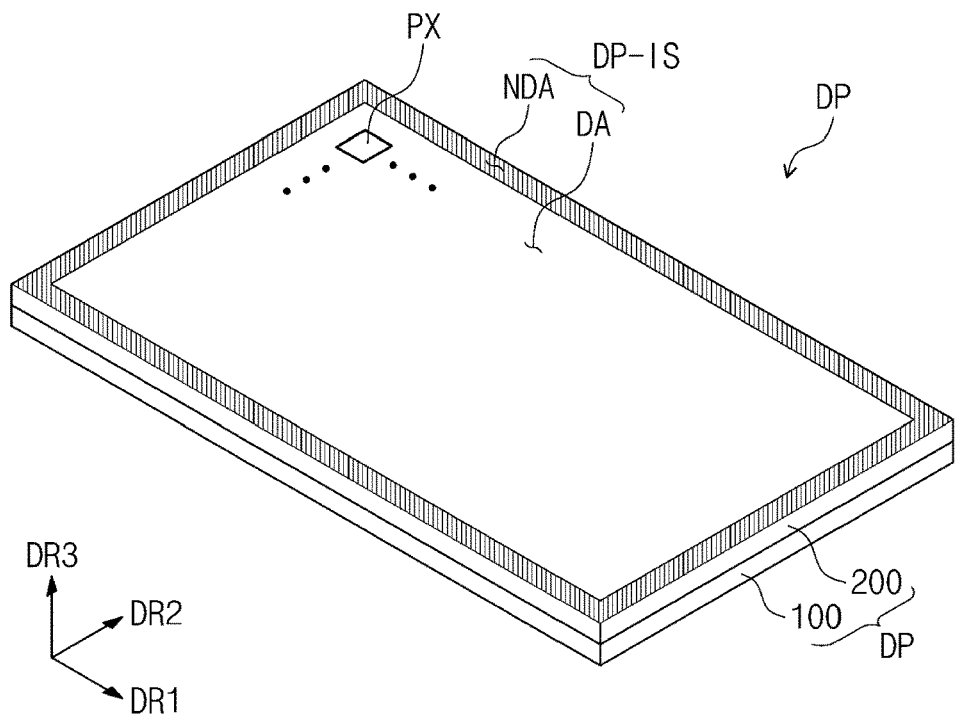
FIG. 1 is a perspective view of a display panel according to an embodiment of the present disclosure.

In this specification, it will be understood that when one component (or region, layer, portion) is referred to as being "on", "connected to", or "coupled to" another component, the one component may be directly "on", "connected to", or "coupled to" the other component, or one or more intervening third components may also be present.

Like reference numerals refer to like elements throughout. Also, in the figures, the thickness, ratio, and dimensions of components may be exaggerated for clarity of illustration.

The term "and/or" includes any and all combinations of one or more of the associated listed items.

It will be understood that although terms such as 'first' and 'second' are used herein to describe various elements, these elements should not be limited by these terms.

The terms are only used to distinguish one component from other components. For example, an element referred to as a first element in one embodiment can be referred to as a second element in another embodiment without departing from the scope of the appended claims. The terms of a singular form may include plural forms, unless the context clearly indicates otherwise.

Also, terms such as "under", "below", "above", "upper", and the like are used for explaining the relationship of the components illustrated in the drawings, and these components should not be limited by these terms. The terms may be a relative concept and described based on directions expressed in the drawings.

Unless otherwise defined, all terms (including technical and scientific terms) used herein have the same meaning as commonly understood by a person of ordinary skill in the art to which the subject matter of the present disclosure belongs. Also, terms, such as defined terms in commonly used dictionaries, are to be interpreted as having meanings consistent with their meaning in the context of the relevant art and/or the present specification, and should not be interpreted in an idealized or overly formal sense, unless expressly so defined herein.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, exemplary embodiments of the present disclosure will be described with reference to the accompanying drawings.

Figure 2:
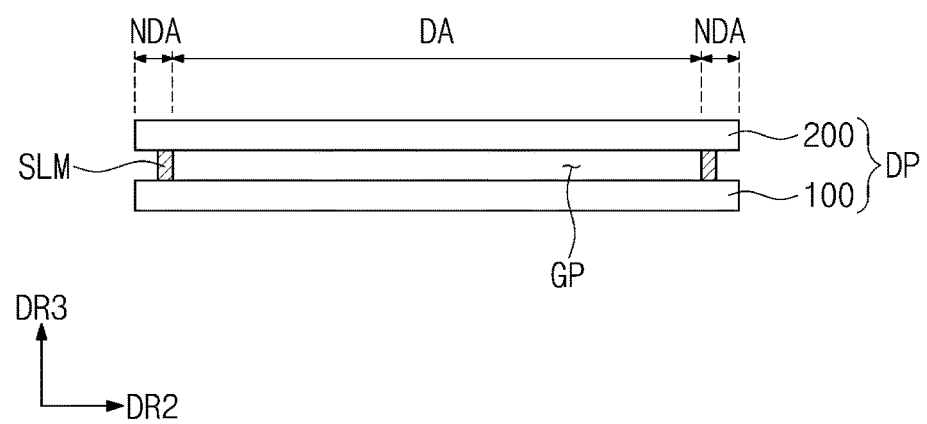
FIG. 2 is a cross-sectional view of the display panel according to an embodiment of the present disclosure.

FIG. 1 is a perspective view of a display panel according to an embodiment of the present disclosure. FIG. 2 is a cross-sectional view of the display panel according to an embodiment of the present disclosure;

A display panel DP according to an embodiment of the present disclosure may be applied to large electronic devices such as a monitor or an external billboard, as well as small and middle (e.g., small and medium size) electronic devices such as a personal computer, a notebook computer, a personal digital terminal, a car navigation unit, a game console, a smart phone, a tablet, and a camera. However, application of the display panel DP is not limited to the herein above-described devices, and the display panel DP may be adopted for other electronic equipment unless departing from the spirit and scope of the present disclosure.

According to an embodiment of the present disclosure, the display panel DP may generate an image, and the generated image may be transmitted to an external user through a window. The display panel DP may be an organic light emitting display panel, a liquid crystal display panel, or a quantum dot light emitting display panel, but is not limited thereto. For example, the organic light emitting display panel may include organic light emitting elements. The liquid crystal display panel may include liquid crystal molecules. In the quantum dot light emitting display panel may include a quantum dot and a quantum rod.

The display panel DP may further include a chassis member or a molding member and, when the display panel DP is a liquid crystal display panel, may further include a backlight unit. Hereinafter, in this specification, the display panel DP that is an organic light emitting display panel will be described.

Referring to FIG. 1, the display panel DP may include a lower display substrate 100 and an upper display substrate 200 facing the lower display substrate 100 and spaced apart from the lower display substrate 100. As illustrated in FIG. 1, the display panel DP may display an image through a display surface DP-IS. The display surface DP-IS may be parallel (e.g., substantially parallel) to a surface defined by a first direction DR1 and a second direction DR2.

The display surface DP-IS may include a display area DA and a non-display area NDA. A pixel PX may be on the display area DA and may not be on the non-display area NDA. The non-display area NDA may be defined along an edge of the display surface DP-IS. According to an embodiment, the display area DA may be surrounded by the non-display area NDA. However, the present disclosure is not limited thereto. For example, the non-display area NDA may be adjacent to one side of the display area DA or may be omitted.

A normal direction of the display surface DP-IS, e.g., a thickness direction of the display panel DP, may be a third direction DR3. In this specification, "when viewed on a plane or on the plane" or "in a plan view" may mean an embodiment when viewed in the third direction DR3. A front surface (or a top surface) and a rear surface (or a bottom surface) of each of layers or units, which will be described herein below, are distinguished by the third direction DR3. However, directions indicated as the first to third direction DR1, DR2, and DR3 may be changed into different directions, such as, for example, opposite directions as a relative concept.

According to an embodiment of the present disclosure, although the display panel DP having a planar display surface DP-IS is illustrated, the present disclosure is not limited thereto. For example, the display panel DP may include a display surface DP-IS of which at least a portion has a curved shape or a display surface DP-IS having a solid shape on the plane. The solid display surface may include a plurality of display areas that indicate different directions.

Referring to FIG. 2, an inner space GP may be defined between the upper display substrate 200 and the lower display substrate 100. The inner space GP may be maintained by an adhesion member SLM between the upper display substrate 200 and the lower display substrate 100. For example, the adhesion member SLM may include an organic adhesion member or an inorganic adhesion member.

Figure 3:
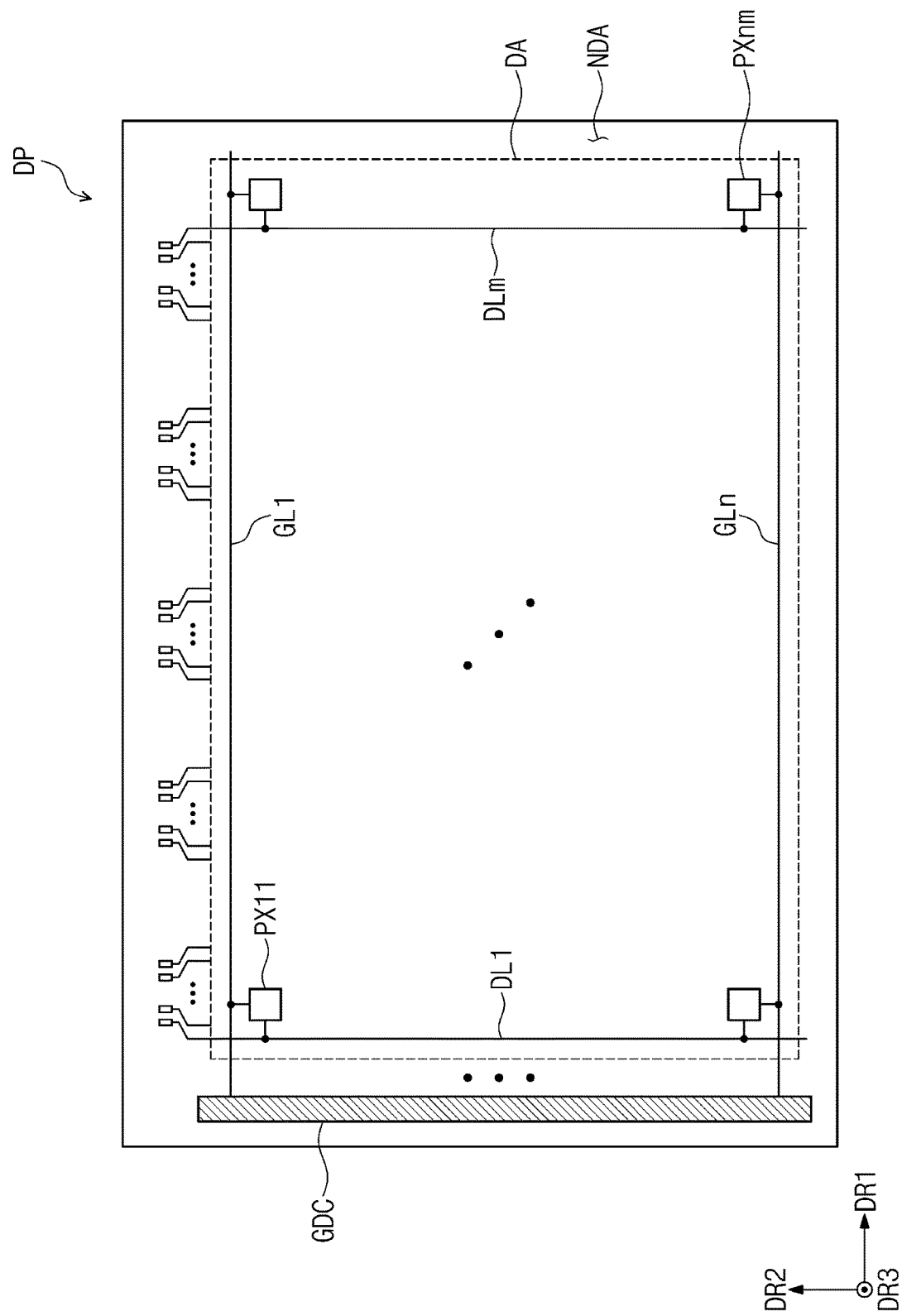
FIG. 3 is a plan view of the display panel according to an embodiment of the present disclosure.

FIG. 3 is a plan view of the display panel according to an embodiment of the present disclosure.

Referring to FIG. 3, the display panel DP may include a gate driver circuit GDC, pixels PX11 to PXnm, and signal lines GL1 to GLn and DL1 to DLm. FIG. 3 illustrates an arrangement relationship between the signal lines GL1 to GLn and DL1 to DLm and the pixels PX11 to PXnm on a plane.

On the plane, the pixels PX11 to PXnm overlap the display area DA, and the signal lines GL1 to GLn and DL1 to DLm and the gate driver circuit GDC overlap the non-display area NDA. The signal lines GL1 to GLn and DL1 to DLm may include a plurality of gate lines GL1 to GLn, and a plurality of data lines DL1 to DLm.

Each of the pixels PX11 to PXnm are connected to (e.g., couple to) the corresponding gate lines of the plurality of gate lines GL1 to GLn and the corresponding data lines of the plurality of data lines DL1 to DLm, respectively. Each of the pixels PX11 to PXnm may include a pixel driving circuit and a display element. More kinds of signal lines may be provided on the display panel DP according to a configuration of the pixel driving circuit.

The pixels PX11 to PXnm may be arranged in a matrix form, but are not limited thereto. For example, the pixels PX11 to PXnm may be arranged in the form of a pentile, or the pixels PX11 to PXnm may be arranged in the form of a diamond.

A gate driver circuit GDC may be on the non-display area NDA. The gate driver circuit GDC may be integrated with the display panel DP through, for example, an oxide silicon gate driver circuit (OSG) process or an amorphous silicon gate driver circuit (ASG) process. However, embodiments of the present disclosure are not limited thereto, and other processes may be used to integrate the gate driver circuit GDC with the display panel DP.

Figure 4B:
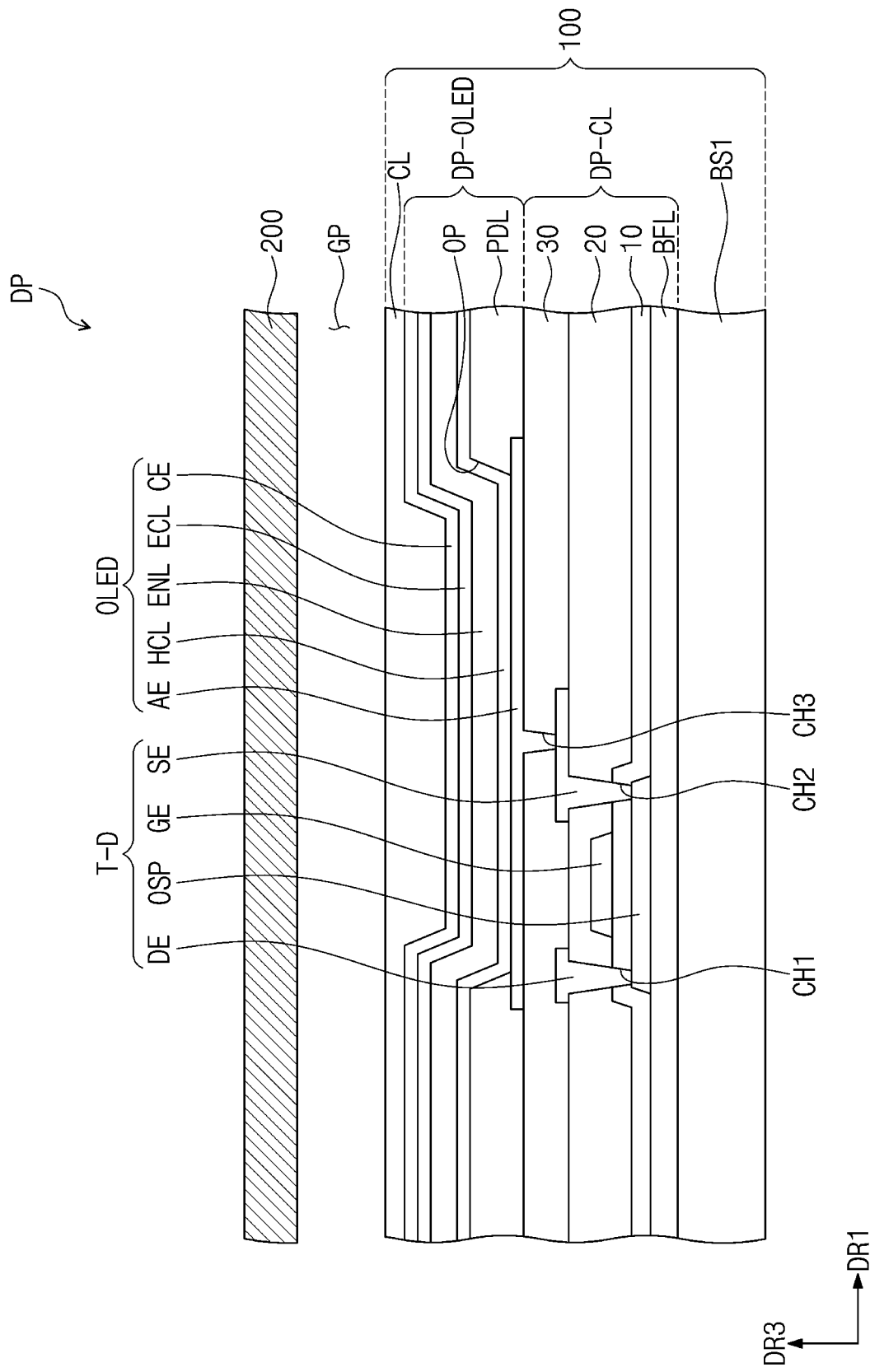
FIG. 4B is a cross-sectional view of the display panel that shows a portion of a pixel area according to an embodiment of the present disclosure.

FIG. 4A is a plan view illustrating pixel areas of the display area of the display panel according to an embodiment of the present disclosure. FIG. 4B is a cross-sectional view of the display panel that shows a portion of the pixel area according to an embodiment of the present disclosure.

FIG. 4A is an enlarged view illustrating a portion of the display area DA of FIG. 1. The display area DA may include a plurality of pixel areas PXA and a light blocking area NPXA adjacent to the plurality of pixel areas PXA. On the plane, the light blocking area NPXA may surround the pixel areas PXA. For example, three kinds of pixel areas PXA-R, PXA-G, and PXA-B are illustrated in FIG. 4A. The three kinds of pixel areas PXA-R, PXA-G, and PXA-B of FIG. 4A may be repeatedly arranged on the entire display area DA.

A light blocking area NPXA may be arranged around the first to third pixel areas PXA-R, PXA-G, and PXA-B, respectively. The first to third pixel areas PXA-R, PXA-G, and PXA-B and the light blocking area NPXA may be substantially defined on the upper display substrate 200.

In this specification, the pixel area PXA means an area through which light may be actually emitted to the outside through the display surface DP-IS that is described with reference to FIG. 1. The pixel areas PXA may emit the received light to the outside, and the light blocking area NPXA may absorb or reflect the received light.

Although the first to third pixel areas PXA-R, PXA-G, and PXA-B are illustrated in FIG. 4A as having the same surface areas on the plane, the present disclosure is not limited thereto. For example, the first to third pixel areas PXA-R, PXA-G, and PXA-B may have surface areas different from each other or have at least two or more areas different from each other.

Also, although the first to third pixel areas PXA-R, PXA-G, and PXA-B are illustrated in FIG. 4A as each having a rectangular shape with rounded corners, the present disclosure is not limited thereto. For example, the first to third pixel areas PXA-R, PXA-G, and PXA-B may have other polygonal shapes on the plane. For example, each of the first to third pixel areas PXA-R, PXA-G, and PXA-B may have a square shape with rounded corners.

One of the first to third pixel areas PXA-R, PXA-G, and PXA-B may provide first color light having a wavelength band corresponding to a first color to the user, another one of the first to third pixel areas PXA-R, PXA-G, and PXA-B may provide second color light having a wavelength band corresponding to a second color different from the first color to the user, and the remaining pixel may provide third color light having a wavelength band corresponding to a third color different from both the first color and the second color to the user.

For example, the first pixel area PXA-R may emit red light, the second pixel area PXA-G may emit green light, and the third pixel area PXA-B may emit blue light. According to an embodiment of the present disclosure, source light may be blue light that is the first color light. The source light may be generated in a light source such as, for example, a backlight unit or generated in a display element such as, for example, a light emitting diode.

The light blocking area NPXA may define a boundary between the first to third pixel areas PXA-R, PXA-G, and PXA-B to prevent or reduce the mixture of the colors with each other between the first to third pixel areas PXA-R, PXA-G, and PXA-B. Also, the light blocking area NPXA may block some or all of the source light so that the source light provided to the user may be prevented or reduced.

For example, the display panel DP, according to an embodiment of the present disclosure, may include a barrier overlapping the light blocking area NPXA. The barrier may prevent or reduce the output of light from two pixel areas adjacent to each other and improve light emission efficiency of light emitted from each of the pixel areas PXA. This will be described in more detail with reference to FIG. 5.

FIG. 4B is a cross-sectional view illustrating an example of a driving transistor T-D corresponding to any one pixel area of the first to third pixel areas PXA-R, PXA-G, and PXA-B and the display panel DP corresponding to the light emitting element OLED. However, the structure corresponding to the pixel area is not limited thereto. For example, the pixel PX may further include a switching transistor connected to (e.g., coupled to) the driving transistor T-D. The switching transistor may be connected to (e.g., coupled to) the signal lines GL1 to GLn and DL1 to DLm. In FIG. 4B, the upper display substrate 200 is schematically illustrated.

Referring to FIG. 4B, the lower display substrate 100 includes a first base substrate BS1, a circuit element layer DP-CL on the first base substrate BS1, a display element layer DP-OLED on the circuit element layer DP-CL, and a cover layer CL.

The first base substrate BS1 may include a synthetic resin substrate or a glass substrate. The circuit element layer DP-CL may include at least one insulation layer and a circuit element. The circuit element may include the signal line and the driving circuit of the pixel. The circuit element layer DP-CL may be formed through a process of forming an insulation, a semiconductor layer, and a conductive layer by coating or deposition and a process of patterning the insulation, the semiconductor layer, and the conductive layer by a photolithography process.

In this embodiment, the circuit element layer DP-CL may include a buffer layer BFL, a first insulation layer 10, a second insulation layer 20, and a third insulation layer 30. For example, each of the first insulation layer 10 and the second insulation layer 20 may be an inorganic layer, and the third insulation layer 30 may be an organic layer. However, the present disclosure is not limited thereto. For example, each of the first insulation layer 10 and the second insulation layer 20 may be a layer in which an inorganic layer and an organic layer are mixed with each other.

FIG. 4B illustrates an example of an arrangement relationship of a semiconductor pattern OSP, a control electrode GE, an input electrode DE, and an output electrode SE, which may be included in the driving transistor T-D. First, second, and third through-holes CH1, CH2, and CH3, respectively, are illustrated exemplarily.

The display element layer DP-OLED includes the light emitting element OLED as a display element. The light emitting element OLED may generate the above-described source light. The light emitting element OLED may include the first electrode AE, the second electrode CE, and a light emitting layer ENL between the first and second electrodes AE and CE. In this embodiment, the light emitting element OLED may include an organic light emitting diode. The display element layer DP-OLED may include a pixel defining layer PDL. For example, the pixel defining layer PDL may be an organic layer.

A first electrode AE may be on the third insulation layer 30. The first electrode AE may be connected to (e.g., coupled to) the output electrode SE through the third through-hole CH3 penetrating through the third insulation layer 30. A light emitting opening OP may be defined in the pixel defining layer PDL. According to an embodiment of the present disclosure, the light emitting opening OP may be defined as an area on which the first color light may be emitted from the light emitting layer ENL.

The light emitting opening OP of the pixel defining layer PDL may expose at least a portion of the first electrode AE. According to an embodiment of the present disclosure, the light emitting opening OP may be defined as an emission area on which actual light may be emitted from the light emitting element OLED. For example, the emission area may be arranged in plurality, and the plurality of emission areas may respectively correspond to the pixel areas.

A hole control layer HCL, the light emitting layer ENL, and an electron control layer ECL may be commonly on the first electrode AE and the pixel defining layer PDL. The hole control layer HCL, the light emitting layer ENL, and the electron control layer ECL may be commonly on the first to third pixel areas PXA-R, PXA-G, and PXA-B.

The hole control layer HCL may include a hole transport layer and may further include a hole injection layer. The light emitting layer ENL may generate blue light. The blue light may include a wavelength between about 410 nm to about 480 nm. An emission spectrum of the blue light may have a maximum peak within a wavelength range of about 440 nm to about 460 nm. The electron control layer ECL may include an electron transport layer and may further include an electron injection layer. The light emitting layer ENL may have a tandem structure or a single layer structure.

A second electrode CE may be on the electronic control layer ECL. The second electrode CE may be commonly on the first to third pixel areas PXA-R, PXA-G, and PXA-B. The second electrode CE may have a surface area greater than that of the first electrode AE.

The cover layer CL may be on the second electrode CE. The cover layer CL may protect the second electrode CE. The cover layer CL may include an organic material or an inorganic material. In an embodiment, the cover layer CL may be omitted.

The lower display substrate 100 may include first to third light emitting elements corresponding to the first to third pixel areas PXA-R, PXA-G, and PXA-B of FIG. 4A. The first to third light emitting elements may have the same laminated structure as each other and also may have the same laminated structure as the light emitting element OLED of FIG. 4B.

Figure 5:
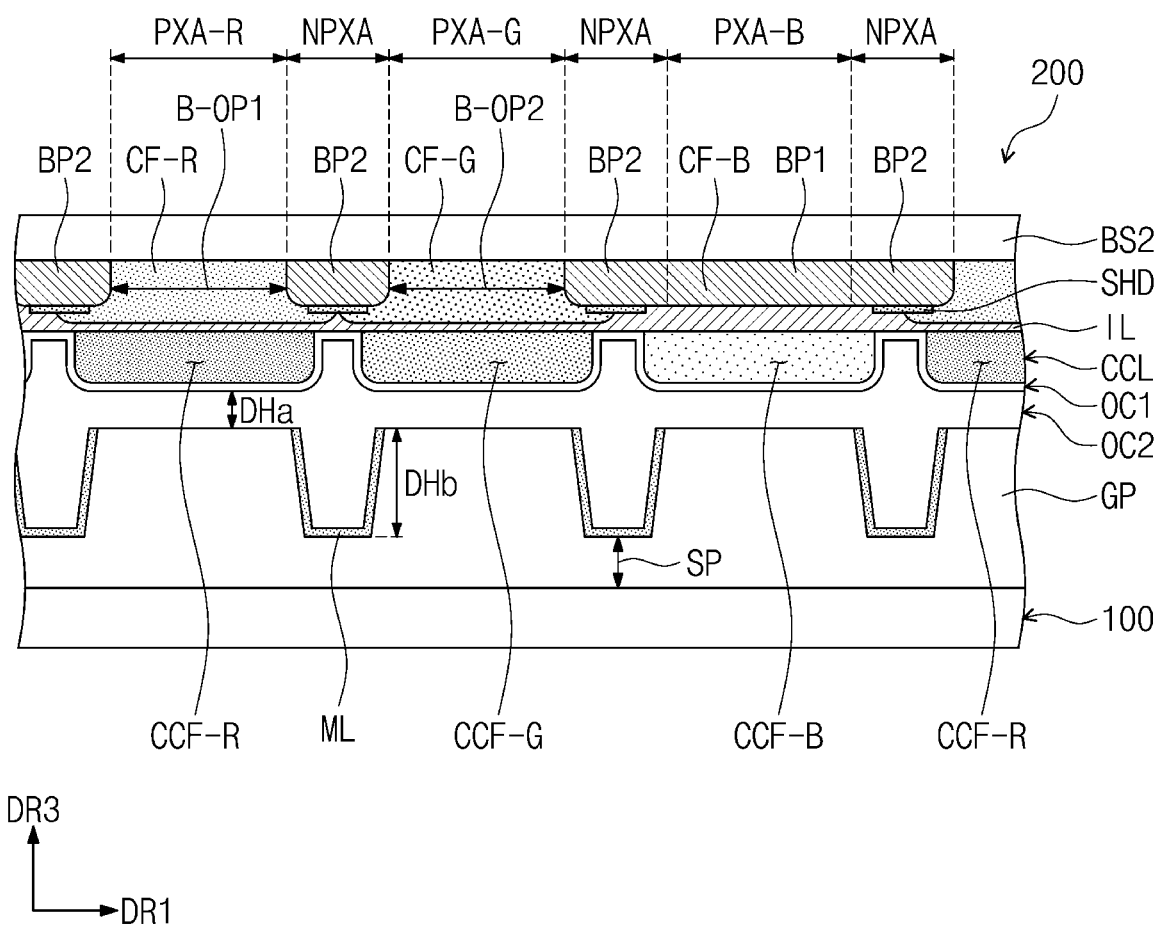
FIG. 5 is a cross-sectional view of an upper display substrate according to an embodiment of the present disclosure.
Figure 6A:
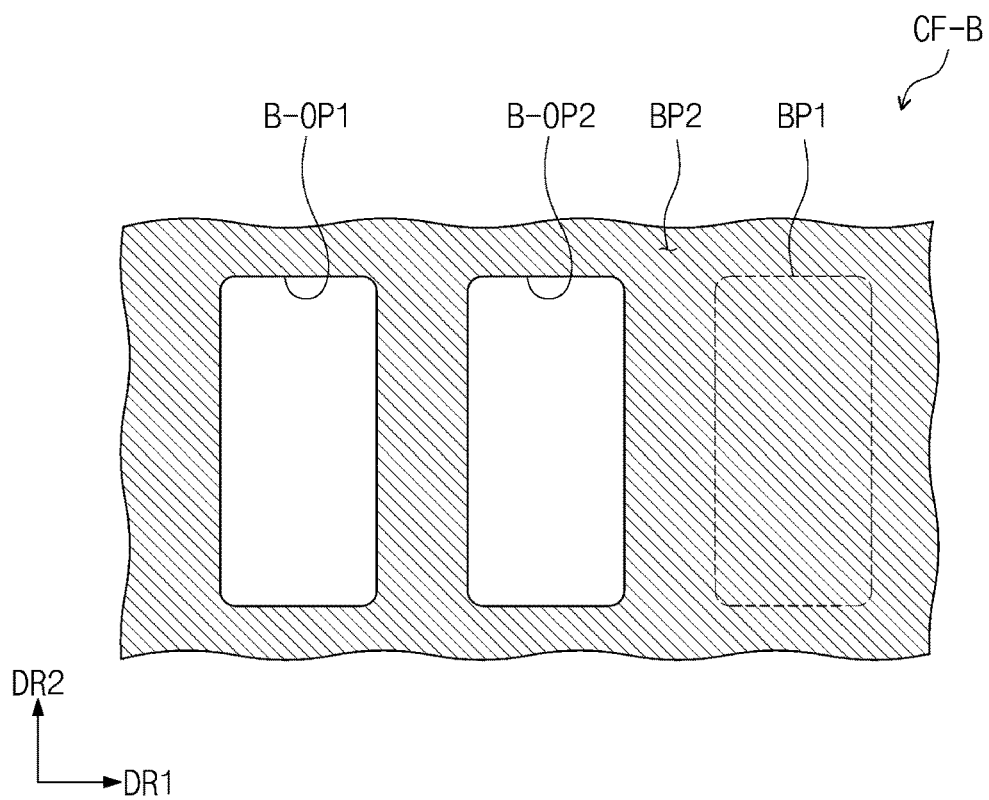
FIG. 6A is a plan view illustrating laminated structures of the upper display substrate according to an embodiment of the present disclosure.
Figure 6B:
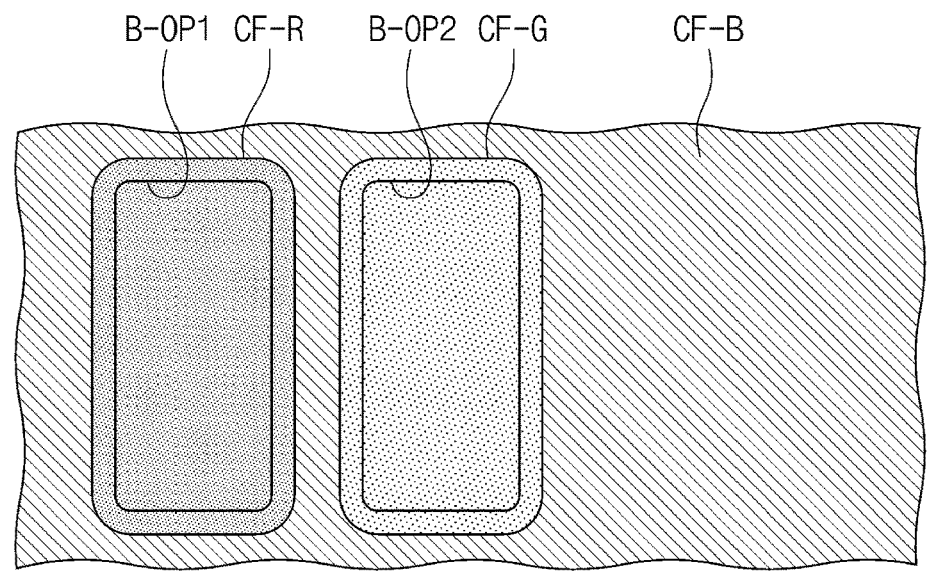
FIG. 6B is a plan view illustrating laminated structures of the upper display substrate according to an embodiment of the present disclosure.
Figure 6C:
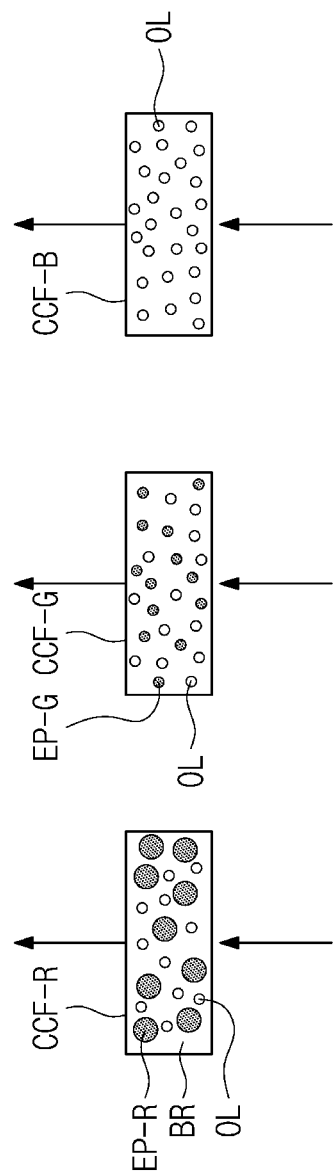
FIG. 6C is a schematic view illustrating light characteristics of a light control layer according to an embodiment of the present disclosure.

FIG. 5 is a cross-sectional view of the upper display substrate according to an embodiment of the present disclosure. FIG. 6A is a plan view illustrating laminated structures of the upper display substrate according to an embodiment of the present disclosure. FIG. 6B is a plan view illustrating laminated structures of the upper display substrate according to an embodiment of the present disclosure. FIG. 6C is a schematic view illustrating light characteristics of a light control layer according to an embodiment of the present disclosure.

Referring to FIG. 5, the upper display substrate 200 may include a second base substrate BS2, first to third color filters CF-R, CF-G, and CF-B, respectively, an upper insulation layer IL, a first light control layer CCL, a first capping layer OC1, a second capping layer OC2, and a second light control layer ML.

The first to third color filters CF-R, CF-G, and CF-B may be on (e.g., under) the second base substrate BS2. In this specification, the first to third color filters CF-R, CF-G, and CF-B may be defined as constituents provided in a color filter layer. According to an embodiment, the first to third color filters CF-R, CF-G, and CF-B may be directly on (e.g., under) the second base substrate BS2.

In this specification, that "a constituent A is directly on (e.g., under) a constituent B" may mean that an adhesion member is not between the constituents A and B. For example, the first to third color filters CF-R, CF-G, and CF-B may be directly on (e.g., under) the second base substrate BS2 without using an adhesion layer.

The first color filter CF-R may overlap the first pixel area PXA-R to transmit light having a wavelength band corresponding to a second color different from a first color and may absorb light having other wavelength bands. For example, the second color may be a red color. The second color filter CF-G may overlap the second pixel area PXA-G to transmit light having a wavelength band corresponding to a third color different from the second color and may absorb light having other wavelength bands. For example, the third color may be a green color. The third color filter CF-B may overlap the third pixel area PXA-B to transmit light having a wavelength band corresponding to the first color and may absorb light having other wavelength bands.

According to an embodiment of the present disclosure, the first to third color filters CF-R, CF-G, and CF-B overlapping the display area DA may be partitioned by a light blocking layer SHD or a light blocking portion BP2.

According to an embodiment of the present disclosure, the third color filter CF-B may have a refractive index similar to that of the second base substrate BS2 rather than that of each of the first color filter CF-R and the second color filter CF-G. As a result, external light introduced from the outside may pass through the second base substrate BS2 and then be incident on the third color filter CF-B. Thus, external light reflection occurring on an interface between the second base substrate BS2 and the third color filter CF-B may be reduced. However, the present disclosure is not limited thereto. For example, each of the first to third color filters CF-R, CF-G, and CF-B may have a refractive index similar to that of the second base substrate BS2.

The third color filter CF-B may be divided into a filter portion BP1 serving as a color filter and the light blocking portion BP2 performing a light blocking function. The filter portion BP1 may overlap the third pixel area PXA-B, and the light blocking portion BP2 may overlap the light blocking area NPXA.

In more detail, referring to FIG. 6A, an organic layer having a blue color may be on (e.g., under) one surface of the second base substrate BS2 and may define the third color filter CF-B having a first opening B-OP1 and a second opening B-OP2. For example, the filter portion BP1 and the light blocking portion BP2 may be included in a single body.

Referring to FIG. 6B, the first color filter CF-R may be in the first opening B-OP1 defined in the third color filter CF-B. On the plane, the first color filter CF-R may entirely cover (e.g., overlap) the first opening B-OP1 and may be on (e.g., under) at least a portion of the light blocking portion BP2. The second color filter CF-G may be in the second opening B-OP2 defined in the third color filter CF-B. On the plane, the second color filter CF-G may entirely cover (e.g., overlap) the second opening B-OP2 and may be on (e.g., under) at least a portion of the light blocking portion BP2.

Referring again to FIG. 5, the light blocking layer SHD may be on (e.g., under) the light blocking portion BP2 of the third color filter CF-B. Each of a portion of the first color filter CF-R and a portion of the second color filter CF-G may cover a portion of the light blocking layer SHD. An edge of the first color filter CF-R and the light blocking layer SHD may absorb some or all of the external light transmitted through the light blocking portion BP2 to prevent or reduce the mixture of the colors with each other between the first to third pixel areas PXA-R, PXA-G, and PXA-B. Also, the light blocking layer SHD may absorb a portion of light outputted from the first light control layer CCL.

The upper insulation layer IL may cover the first to third color filters CF-R, CF-G, and CF-B and may be on (e.g., under) the second base substrate BS2. For example, the upper insulation layer IL may be an inorganic layer.

The first light control layer CCL may be on (e.g., under) the upper insulation layer IL to control the first color light emitted from the display element layer DP-OLED illustrated in FIG. 4B. For example, the first light control layer CCL may receive the first color light to convert the first color light into different color light or transmit the first color light as it is.

The first light control layer CCL may include a first conversion part CCF-R, a second conversion part CCF-G, and a transmission part CCF-B. The first conversion part CCF-R may overlap the first pixel area PXA-R to convert the first color light into the second color light different from the first color light and may emit the second color light. The second conversion part CCF-G may overlap the second pixel area PXA-G to convert the first color light into the third color light different from the second color light and may emit the third color light. The transmission part CCF-B may overlap the third pixel area PXA-B to transmit the first color light.

In more detail, referring to FIG. 6C, the first conversion part CCF-R may include a first light emitting material EP-R, which may absorb the first color light (e.g., blue light) and may emit the second color light (e.g., red light). The second conversion part CCF-G may include a second light emitting material EP-G, which may absorb the first color light and may emit the third color light (e.g., green light). The transmission part CCF-B may be a portion that does not include light emitting material. The transmission part CCF-B may be a portion that transmits the first color light.

Also, each of the first conversion part CCF-R, the second conversion part CCF-G, and the transmission part CCF-B may include a base resin BR. The base resin BR may be a polymer resin. For example, the base resin BR may include an acrylic-based resin, a urethane-based resin, a silicone-based resin, and/or an epoxy-based resin. The base resin BR may be a transparent resin.

Also, each of the first conversion part CCF-R, the second conversion part CCF-G, and the transmission part CCF-B may include scattering particles OL. The scattering particles OL may be $TiO_2$ or silica-based nano particles. The scattering particles OL may scatter light emitted from the light emitting material to emit the light to the outside of the conversion part. Also, when the transmission part CCF-B transmits the light as it is, the scattering particles OL may scatter the provided light to emit the light to the outside.

Each of the first and second light emitting materials EP-R and EP-G (which may also be referred to as light emitting materials) that may be included in the first light control layer CCL may be phosphors or quantum dots. For example, the first light control layer CCL, according to an embodiment, may include at least one of the phosphors or the quantum dots of the first and second light emitting materials EP-R and EP-G.

For example, the phosphor that may be used as the light emitting materials EP-R and EP-G may be inorganic phosphors. In some embodiments, the phosphors that may be used as the light emitting materials EP-R and EP-G, according to an embodiment, may be green phosphors or red phosphors.

However, the kinds of phosphors used in the first light control layer CCL, according to an embodiment, are not limited to the phosphor materials described herein above. For example, any suitable phosphor materials generally used in the art, in addition to those described herein above, may be used.

For another example, the light emitting materials EP-R and EP-G that may be included in the first light control layer CCL may be quantum dots. A core of the quantum dot may be selected from Group II-VI compounds, Group III-V compounds, Group IV-VI compounds, Group IV elements, Group IV compounds, and a combination thereof.

The Group II-VI compounds may be selected from binary element compounds selected from the group consisting of CdSe, CdTe, ZnS, ZnSe, ZnTe, ZnO, HgS, HgSe, HgTe, MgSe, MgS, and any combination thereof; ternary element compounds selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any combination thereof; and quaternary element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and any combination thereof.

The Group III-V compounds may be selected from binary element compounds selected from the group consisting of GaN, GaP, GaAs, GaSb, AlN, AlP, AlAs, AlSb, InN, InP, InAs, InSb, and any combination thereof; ternary element compounds selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and any combination thereof; and quaternary element compounds selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any combination thereof.

The Group IV-VI compounds may be selected from binary element compounds selected from the group consisting of SnS, SnSe, SnTe, PbS, PbSe, PbTe, and any combination thereof; ternary element compounds selected from the group consisting of SnSeS, SnSeTe, SnSTe, PbSeS, PbSeTe, PbSTe, SnPbS, SnPbSe, SnPbTe, and any combination thereof; and quaternary element compounds selected from the group consisting of SnPbSSe, SnPbSeTe, SnPbSTe, and any combination thereof. The Group IV elements may be selected from the group consisting of Si, Ge, and any combination thereof. The Group IV compounds may be binary element compounds selected from the group consisting of SiC, SiGe, and any combination thereof.

In one embodiment, the binary element compounds, the ternary element compounds, and the quaternary element compounds may exist in the quantum dot at a uniform or substantially uniform concentration or may exist in the quantum dot in a state in which concentration distribution is partitioned into partially different states. In another embodiment, the quantum dot may have a core/shell structure in which one quantum dot surrounds another quantum dot. An interface between the core and the shell may have a concentration gradient in which an element existing in the shell has a concentration that gradually decreases along a direction toward a center (e.g., a center of the core).

In some embodiments, the quantum dot may have a core-shell structure, which includes a core including the herein above-described compounds of the quantum dot (e.g., a nano crystal) and a shell surrounding the core. The shell of the quantum dot may serve as a protection layer that prevents or reduces chemical changes to the core to maintain the semiconductor characteristics and/or may serve as a charging layer for imparting electrophoretic characteristics to the quantum dot. The shell may be a single layer or a multi-layer. An interface between the core and the shell may have a concentration gradient in which an element existing in the shell has a concentration that gradually decreases toward a center. For example, the shell of the quantum dot may include an oxide of a metal or nonmetal, a semiconductor compound, or a combination thereof.

For example, the oxide of the metal or nonmetal may include binary element compounds of $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and/or the like or ternary element compounds $MgAl_2O_4$, $CoFe_2O_4$, $NiFe_2O_4$, $CoMn_2O_4$, and/or the like, but the present disclosure is not limited thereto.

In some embodiments, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like, but the present disclosure is not limited thereto.

The quantum dot may have a full width of half maximum (FWHM) of an emission wavelength spectrum of about 45 nm or less, about 40 nm or less, or, for example, about 30 nm or less. In these ranges, color purity and color reproducibility may be improved. Also, light emitted through the quantum dot may be emitted in all directions to improve an optical viewing angle.

Also, the quantum dot may have any suitable shape that is generally used in the art and is not specifically limited in shape. In some embodiments, the quantum dot may have a spherical shape, a pyramidal shape, a multi-arm shape, a cubic nanoparticle shape, a nanotube shape, a nanowire shape, a nanofiber shape, a nanoplate particle shape, or the like.

The quantum dot may adjust a color of emitted light according to a size of the quantum dot. For example, the quantum dot may emit light having various suitable colors such as a blue color, a red color, and a green color.

Referring again to FIG. 5, as described herein above, the first color light emitted from the display element layer DP-OLED through the first light control layer CCL may be converted into light having a different color or may be emitted as it is to the outside through the second base substrate BS2.

The first light control layer CCL may emit a gas under a high-temperature, high-humidity environment that may be higher than a set or predetermined temperature and humidity. The gas emitted by the first light control layer CCL may be affected by various materials contained in the first light control layer CCL. For example, when the base resin BR of FIG. 6C is exposed to the high-temperature environment for a set or predetermined time or more, a gas may be emitted from the base resin BR and permeated into an inner space GP between the lower display substrate 100 and the upper display substrate 200. In this embodiment, each of the first base substrate BS1 and the second base substrate BS2 may be deformed in shape due to expansion of the inner space GP.

According to an embodiment of the present disclosure, the capping layers OC1 and OC2 may be on (e.g., under) the first light control layer CCL. For example, the capping layers OC1 and OC2 according to an embodiment of the present disclosure may include an organic layer and an inorganic layer, which are provided as layers different from each other. As a result, the capping layers OC1 and OC2 may prevent or reduce permeation of the gas emitted from the first light control layer CCL into the inner space GP. For example, the capping layer OC1 and OC2 may prevent or reduce permeation of the gas emitted from the first light control layer CCL into the inner space GP to prevent or reduce the deformation of the display panel DP by the gas.

Hereinafter, the capping layers OC1 and OC2 will be described in more detail. The capping layers OC1 and OC2 may include the first capping layer OC1 and the second capping layer OC2.

The first capping layer OC1 may entirely cover (e.g., cover the bottom surface of) the first light control layer CCL and may be on (e.g., under) the upper insulation layer IL. The first capping layer OC1 may overlap each of the pixel areas PXA-R, PXA-G, and PXA-B and the light blocking area NPXA of the display area DA. Also, the first capping layer OC1 may overlap the non-display area NDA. The first capping layer OC1, according to an embodiment of the present disclosure, may include an inorganic material. In this specification, the first capping layer OC1 may be described as a sub capping layer.

The second capping layer OC2 may be on (e.g., under) the first capping layer OC1. The second capping layer OC2 may overlap each of the pixel areas PXA-R, PXA-G, and PXA-B and the light blocking area NPXA of the display area DA. Also, the second capping layer OC2 may also overlap the non-display area NDA. The second capping layer OC2, according to an embodiment of the present disclosure, may include an organic material.

According to an embodiment of the present disclosure, the second capping layer OC2 may be directly on (e.g., under) the first capping layer OC1. Also, the second capping layer OC2 may have a thickness greater than that of the first capping layer OC1 in the third direction DR3, which is a thickness direction of the second base substrate BS2.

In another embodiment of the present disclosure, the first capping layer OC1 may be omitted. In this embodiment, the second capping layer OC2 may cover (e.g., cover the bottom surface of) the first light control layer CCL to prevent or reduce the permeation of the gas emitted from the first light control layer CCL to the inner space GP. Also, when the first capping layer OC1 is omitted, the second capping layer OC2, according to some embodiments of the present disclosure, may be an organic layer.

The second light control layer ML may be on (e.g., on the bottom surface of the portion of) the second capping layer OC2 that overlaps the light blocking area NPXA. The second light control layer ML may reflect or absorb the first color light that is emitted from the display element layer DP-OLED. For example, the second light control layer ML may be a reflection layer that reflects light or a light blocking layer that absorbs light. The second light control layer ML may prevent or reduce the mixture of light emitted to the outside through the upper display substrate 200.

For example, the second light control layer ML of FIG. 5 may be a reflection layer.

According to an embodiment of the present disclosure, the second light control layer ML may entirely overlap the light blocking area NPXA. However, the present disclosure is not limited thereto. According to another embodiment, the second light control layer ML may partially overlap the light blocking area NPXA.

Also, according to an embodiment of the present disclosure, the second capping layer OC2 and the second light control layer ML on the second capping layer OC2 may be spaced a set or predetermined distance SP from the lower display substrate 100. The inner space GP may be defined between the second capping layer OC2 and the lower display substrate 100.

As described herein above, the first capping layer OC1 and the second capping layer OC2 may contact each other to prevent or reduce permeation of the gas emitted from the first light control layer CCL into the inner space GP. Hereinafter, structures of the second capping layer OC2 and the second light control layer ML will be described in more detail with reference to FIG. 7.

Figure 7:
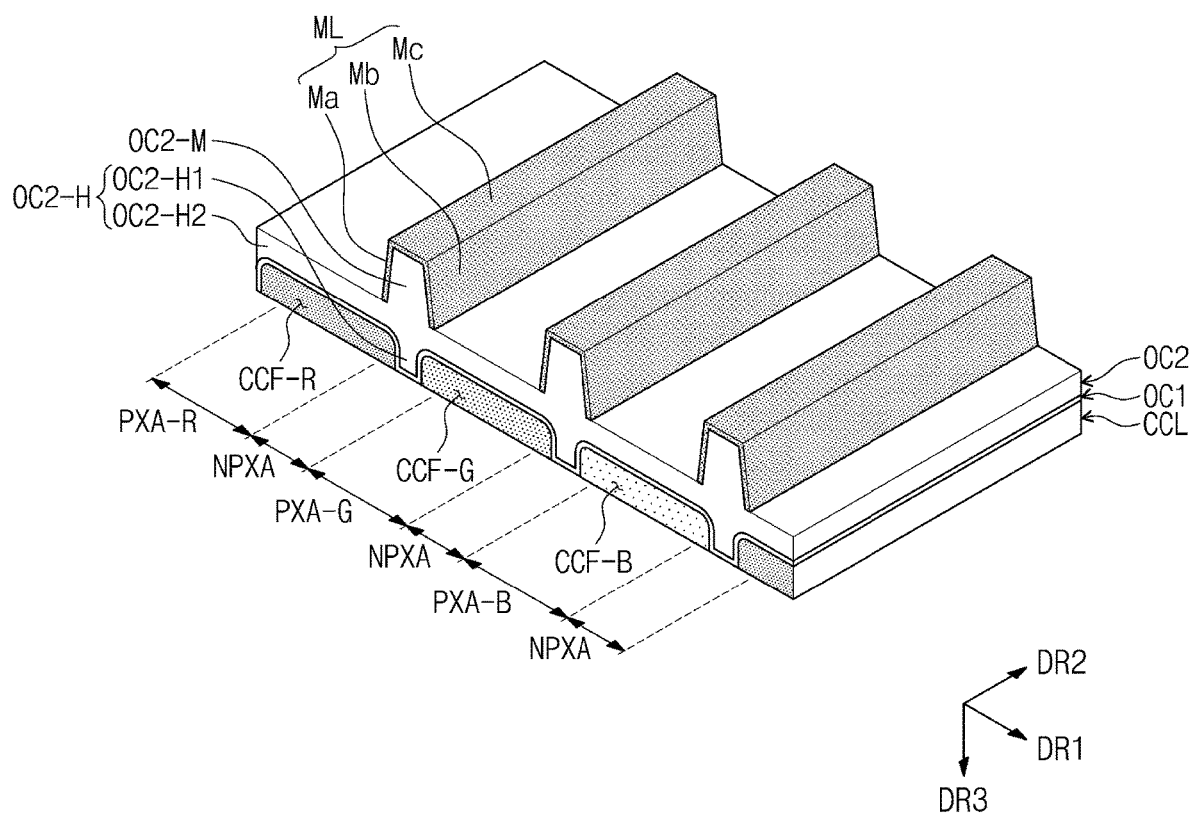
FIG. 7 is a perspective view of a barrier layer of the upper display substrate according to an embodiment of the present disclosure.
Figure 8:
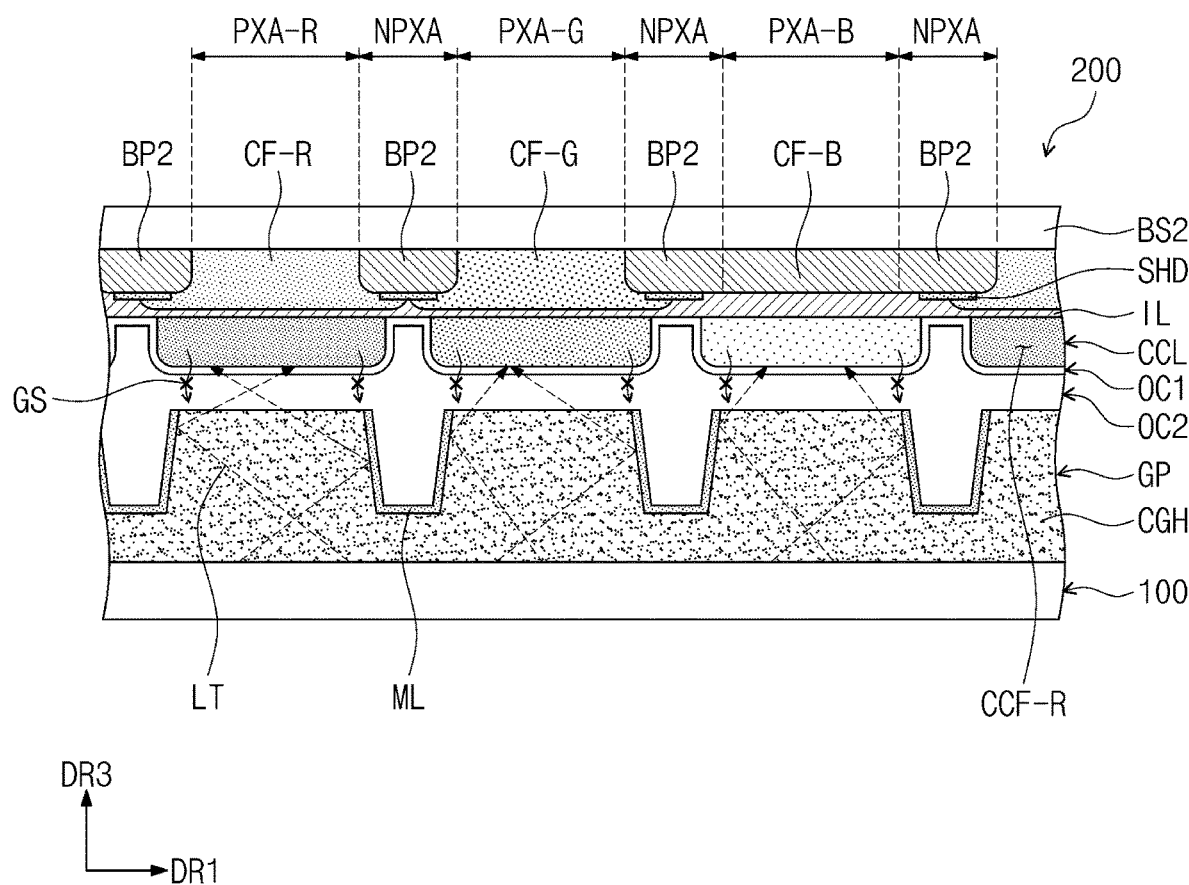
FIG. 8 is a cross-sectional view of the upper display substrate according to an embodiment of the present disclosure.

FIG. 7 is a perspective view of a barrier layer of the upper display substrate according to an embodiment of the present disclosure. FIG. 8 is a cross-sectional view of the upper display substrate according to an embodiment of the present disclosure.

Referring to FIGS. 5 and 7, the first capping layer OC1 may be an inorganic layer that entirely covers (e.g., covers the entire bottom surface of) the first light control layer CCL. The second capping layer OC2 may be an organic layer and may be directly on (e.g., under) the first capping layer OC1.

For example, the second capping layer OC2 may include a barrier part OC2-M, which overlaps both an absorption part OC2-H on (e.g., under) the first capping layer OC1 and a light blocking area NPXA, that protrudes from the absorption part OC2-H in the third direction DR3.

The absorption part OC2-H may include a first absorption part OC2-H1 and a second absorption part OC2-H2. The first absorption part OC2-H1 may overlap the light blocking area NPXA and may be between the first conversion part CCF-R and the second conversion part CCF-G, between the second conversion part CCF-G and the transmission part CCF-B, and between the transmission part CCF-B and the first conversion part CCF-R. The second absorption part OC2-H2 may overlap the display area DA, e.g., each of the pixel areas PXA-R, PXA-G, and PXA-B and the light blocking area NPXA. The second absorption part OC2-H2 may cover (e.g., cover the bottom surface of) the first absorption part OC2-H1 and may be on (e.g., under) the first light control layer CCL.

The barrier part OC2-M may overlap the light blocking area NPXA and may have a shape that protrudes from the second absorption part OC2-H2. The second light control layer ML may be on (e.g., on the bottom surface of) the barrier part OC2-M. The second light control layer ML may be on (e.g., on the bottom surface of) the barrier part OC2-M to prevent or reduce the mixture of light emitted to the outside through the upper display substrate 200. For example, the first color light emitted from one light emitting element OLED may be prevented from being transmitted to the other pixel area, which does not overlap the one light emitting element OLED, of the pixel areas through the second light control layer ML (or such transmission of the first color light may be reduced).

The second light control layer ML, according to an embodiment of the present disclosure, may be a reflection layer including a metal material. Also, the second light control layer ML may be on an entire outer surface of the barrier part OC2-M. As illustrated in FIG. 8, first color light LT emitted from the display element layer DP-OLED of the lower display substrate 100 may be transmitted to the second light control layer ML. In this embodiment, the second light control layer ML may reflect the first color light LT so as to be transmitted to the first light control layer CCL. Thus, overall emission efficiency of the display panel DP may be improved.

Also, as illustrated in FIG. 8, permeation of a gas GS emitted from the first light control layer CCL into the inner space GP may be prevented or reduced by the first capping layer OC1 and the second capping layer OC2. For example, in the display panel DP of FIG. 8, a filler CGH may be in the inner space GP between the lower display substrate 100 and the upper display substrate 200.

Referring again to FIG. 7, the barrier part OC2-M may include first and second outer surfaces facing each other in one direction and connected to (e.g., coupled to) the second absorption part OC2-H2 and a bottom surface connecting (e.g., coupling) the first outer surface to the second outer surface. The second light control layer ML may include a first reflection portion Ma on the first outer surface of the barrier part OC2-M, a second reflection portion Mb on the second outer surface of the barrier part OC2-M, and a third reflection portion Mc on the bottom surface of the barrier part OC2-M.

According to an embodiment of the present disclosure, the first absorption part OC2-H1, the second absorption part OC2-H2, and the barrier part OC2-M may be made of the same (e.g., substantially the same) material and may be integrated with each other. For example, an organic layer may be formed on the first capping layer OC1 and then be exposed and developed to form the first absorption part OC2-H1, the second absorption part OC2-H2, and the barrier part OC2-M. For example, to form the barrier part OC2-M, an exposure time required for the organic layer overlapping the pixel areas PXA-R, PXA-G, and PXA-B may be longer than that of the organic layer overlapping the light blocking area NPXA.

According to an embodiment of the present disclosure, each of the first absorption part OC2-H1 and the second absorption part OC2-H2, which may be an organic layer, may have a thickness greater than that of the first capping layer OC1, which may be an inorganic layer. Also, as illustrated in FIG. 5, the barrier part OC2-M may have a height DHb greater than a thickness DHa of the second absorption part OC2-H2.

Figure 9A:
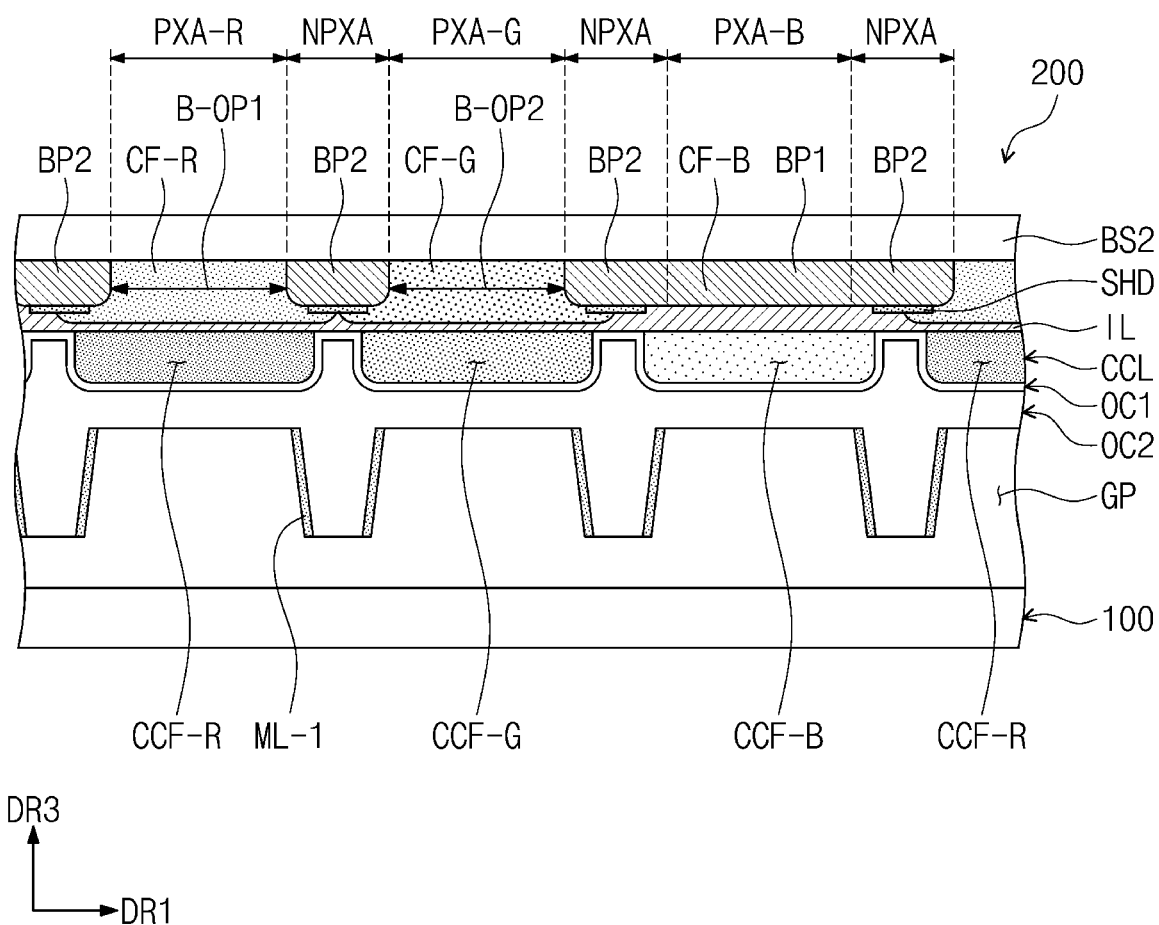
FIG. 9A is a cross-sectional view of an upper display substrate according to another embodiment of the present disclosure.
Figure 9B:
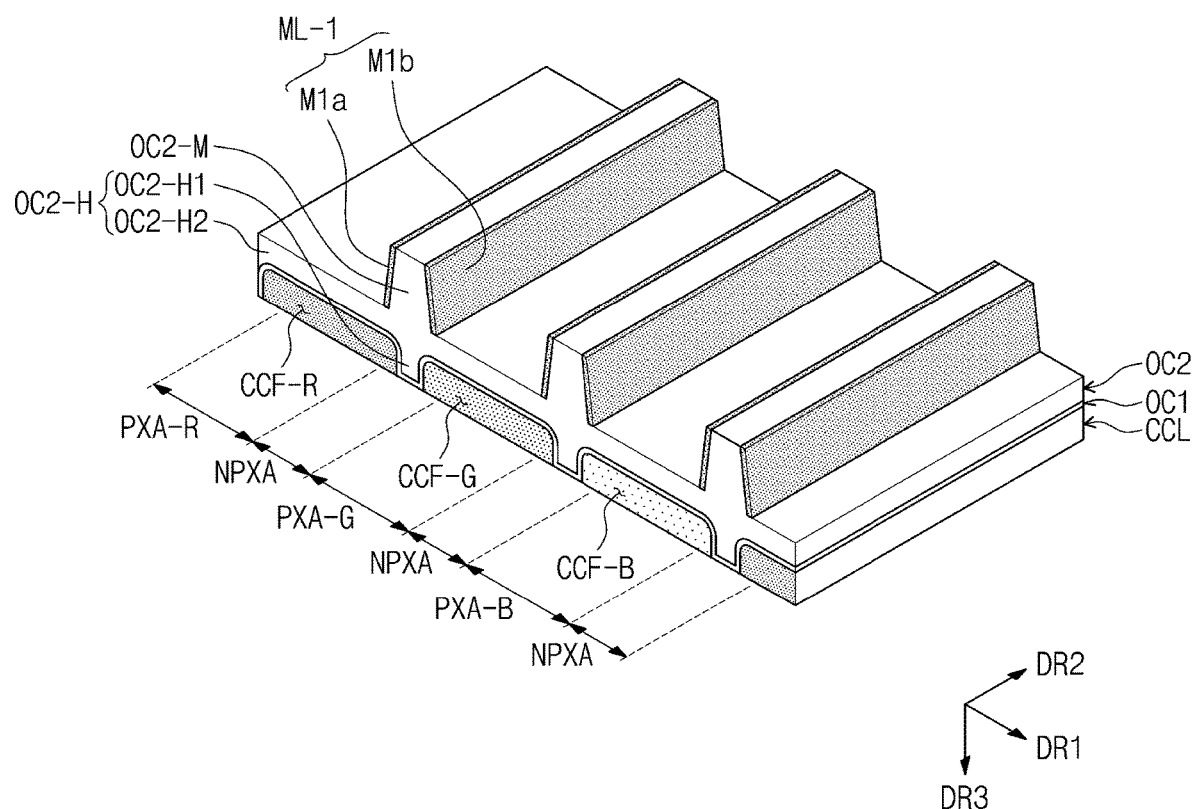
FIG. 9B is a perspective view of a barrier layer of the upper display substrate according to another embodiment of the present disclosure.

FIG. 9A is a cross-sectional view of an upper display substrate according to another embodiment of the present disclosure. FIG. 9B is a perspective view of a barrier layer of the upper display substrate according to another embodiment of the present disclosure.

A display panel DP of FIGS. 9A and 9B may be substantially the same as the display panel DP of FIGS. 5 and 7 except that a structure of a second light control layer ML-1 may be modified. Thus, for convenience of description, a configuration of the second light control layer ML-1 will be mainly described with reference to FIGS. 9A and 9B.

According to an embodiment of the present disclosure, the second light control layer ML-1 may not entirely overlap a light blocking area NPXA, but the second light control layer ML-1 may partially overlap the light blocking area NPXA.

Referring to FIG. 9B, the second light control layer ML-1 may include a first reflection portion M1a on a first outer surface of a barrier part OC2-M and a second reflection portion M1b on a second outer surface of a barrier part OC2-M. According to some embodiments of the present disclosure, at least a portion of the barrier part OC2-M may be exposed to an inner space GP from the second light control layer ML-1, e.g., the reflection layer. In more detail, a bottom surface of the barrier part OC2-M, which may connect (e.g., couple) the first and second outer surfaces of the barrier part OC2-M, may face a lower display substrate 100 and may be exposed to the inner space GP.

Figure 10:
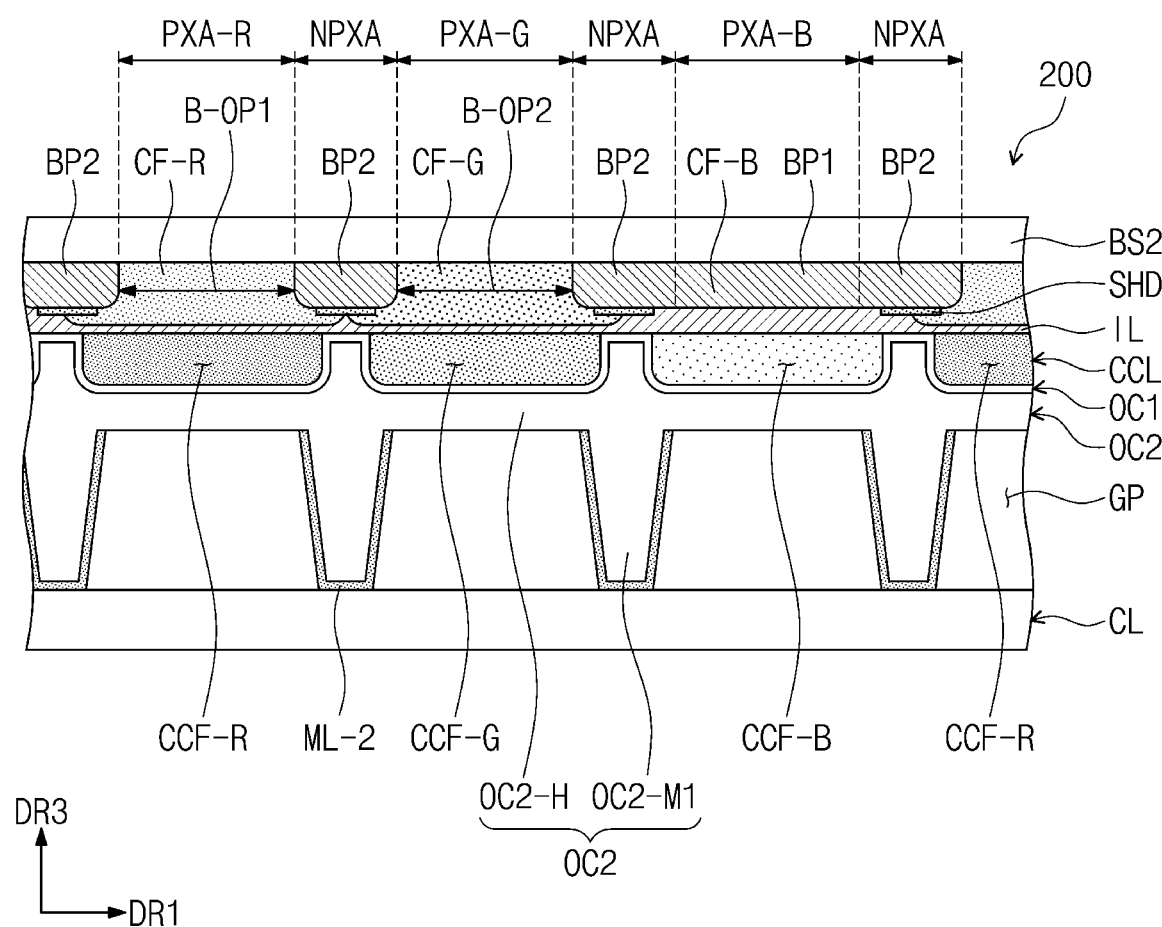
FIG. 10 is a cross-sectional view of an upper display substrate according to another embodiment of the present disclosure.

FIG. 10 is a cross-sectional view of an upper display substrate according to another embodiment of the present disclosure.

A display panel DP of FIG. 10 may be substantially the same as the display panel DP of FIG. 5 except that structures of a barrier part OC2-M1 and a second light control layer ML-2 may be modified. Thus, for convenience of description, configurations of the barrier part OC2-M1 and the second light control layer ML-2 will be mainly described with reference to FIG. 10.

According to an embodiment of the present disclosure, at least a portion of the second light control layer ML-2 may contact the lower display substrate 100. For example, the second light control layer ML-2 may contact a cover layer CL of the lower display substrate 100. Referring to FIG. 10, the part of the second light control layer ML-2 that may be on a bottom surface of the barrier part OC2-M1 may contact the cover layer CL.

According to another embodiment of the present disclosure, when the bottom surface of the barrier part OC2-M1, described with reference to FIGS. 9B and 10, is exposed to the outside by the second light control layer ML-2, the bottom surface of the barrier part OC2-M1 may contact the cover layer CL.

Figure 11:
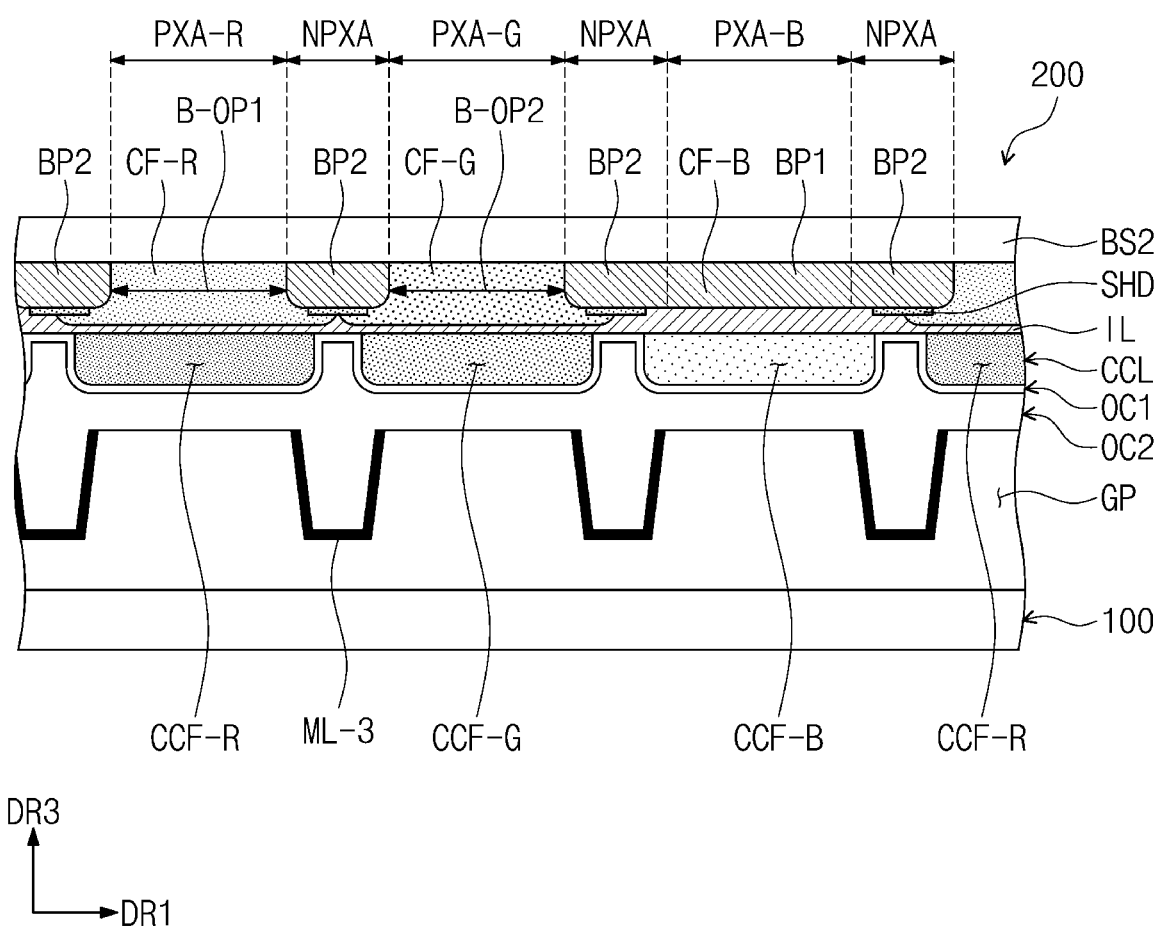
FIGS. 11 and 12 are cross-sectional views of an upper display substrate according to another embodiment of the present disclosure.
Figure 12:
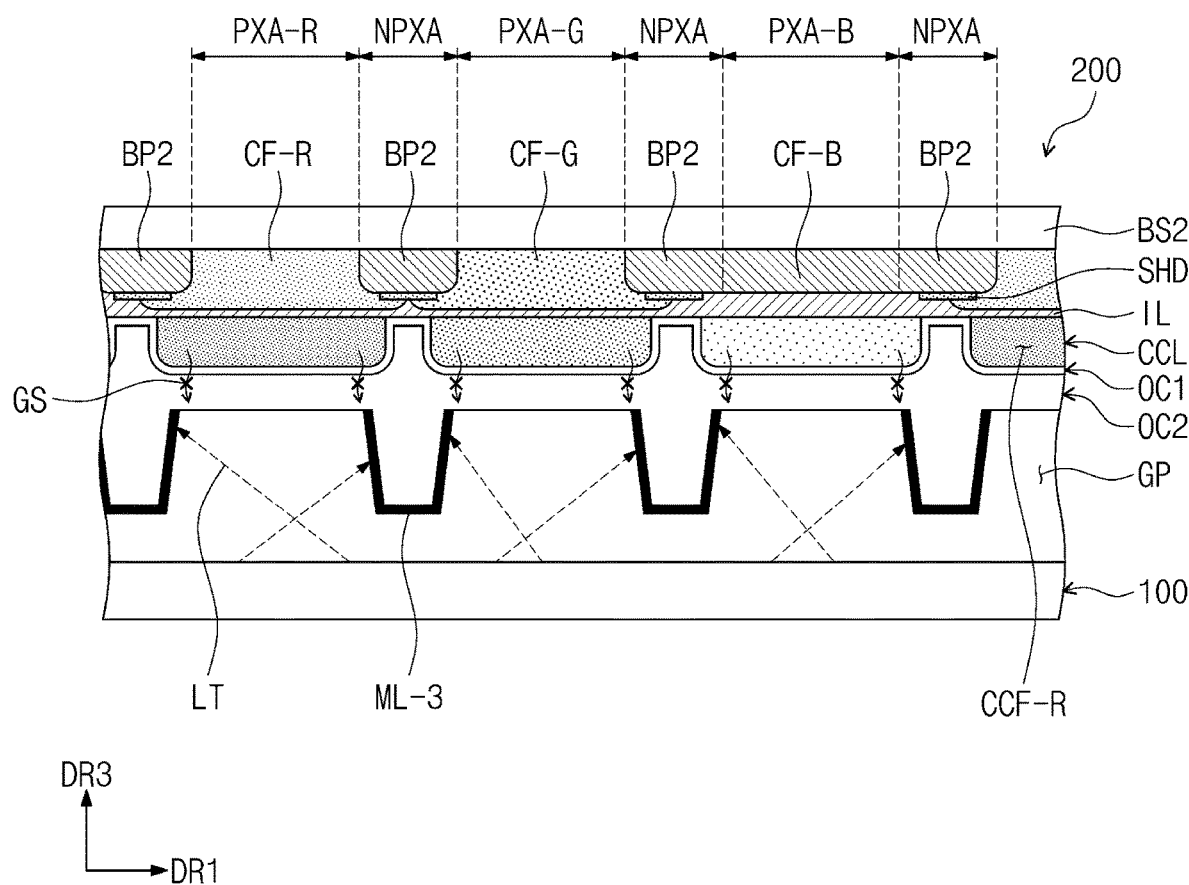

FIGS. 11 and 12 are cross-sectional views of an upper display substrate according to another embodiment of the present disclosure.

A display panel DP of FIGS. 11 and 12 may be substantially the same as the display panel DP of FIG. 5 except that a structure of a second light control layer ML-3 may be modified. Thus, for convenience of description, a configuration of the second light control layer ML-3 will be mainly described with reference to FIGS. 11 and 12.

According to an embodiment of the present disclosure, the second light control layer ML-3 may be a light blocking layer that absorbs light. For example, the second light control layer ML-3 may be a light blocking layer that may be capable of absorbing first color light. For example, the second light control layer ML-3 may have a black color or a yellow color. However, the present disclosure is not limited thereto. For example, the second light control layer ML-3 may have various suitable colors that are capable of absorbing the first color light.

As illustrated in FIG. 12, first color light LT emitted from a lower display substrate 100 may be absorbed by the second light control layer ML-3. As a result, the first color light LT emitted from one light emitting element OLED that may be transmitted to the other pixel area, which does not overlap the one light emitting element OLED, of the pixel areas through the second light control layer ML-3 may be prevented or reduced.

According to the embodiment of the present disclosure, the capping layers OC1 and OC2 may be on (e.g., on the bottom surface of) the first light control layer CCL. The capping layers OC1 and OC2 may prevent or reduce the gas GS discharged from the first light control layer CCL that permeates the inner space GP. For example, the gas GS discharged from the first light control layer CCL that may permeate into the inner space GP and, thereby, deform the display panel DP, may be prevented or reduced by the capping layers OC1 and OC2.

As described above, embodiments are disclosed in the drawings and the specification. While specific terms were used, they were not used to limit the meaning or the scope of the embodiments of the present disclosure as described in the claims, but were merely used to explain the embodiments of the present disclosure. Accordingly, a person having ordinary skill in the art will understand from the above that various modifications and other equivalent or substantially equivalent embodiments are also possible. Hence, the real protective scope of the embodiments of the present disclosure shall be determined by the scope of the accompanying claims.

What is claimed is:

1. A display panel comprising:
an upper display substrate comprising a display area and a non-display area adjacent to the display area, wherein the display area comprises a plurality of pixel areas and a light blocking area adjacent to the pixel areas; and
a lower display substrate that faces the upper display substrate to emit first color light, the lower display substrate comprising a plurality of display elements respectively overlapping the pixel areas,
wherein the upper display substrate comprises:
a base substrate;
a first light control layer on the base substrate to control the first color light;
a capping layer comprising an absorption part overlapping the display area and being on the first light control layer and a barrier part overlapping the light blocking area and protruding from the absorption part in a direction away from the first light control layer in a thickness direction of the base substrate; and
a second light control layer on the barrier part,
wherein the absorption part comprises:
a first absorption part overlapping the light blocking area; and
a second absorption part configured to cover the first absorption part.

2. The display panel of claim 1, further comprising a sub capping layer between the first light control layer and the capping layer,
wherein the sub capping layer entirely covers the first light control layer.

3. The display panel of claim 2, wherein the capping layer is directly on the sub capping layer.

4. The display panel of claim 2, wherein the sub capping layer comprises an inorganic material, and
the capping layer comprises an organic material.

5. The display panel of claim 2, wherein the absorption part has a thickness greater than that of the sub capping layer in the thickness direction.

6. The display panel of claim 1, wherein the pixel areas comprise first to third pixel areas that are arranged in one direction, and the first light control layer comprises:
a first conversion part overlapping the first pixel area and configured to convert the first color light so as to emit second color light;
a second conversion part overlapping the second pixel area and configured to convert the first color light so as to emit third color light different from the second color light; and
a transmission part overlapping the third pixel area and configured to transmit the first color light.

7. The display panel of claim 6,
wherein the first absorption part is between the first conversion part and the second conversion part, between the second conversion part and the transmission part, and between the first conversion part and the transmission part,
wherein the second absorption part overlaps the display area and is on the first light control layer,
wherein the barrier part protrudes from the second absorption part.

8. The display panel of claim 7, wherein the barrier part has a thickness greater than that of the second absorption part in the thickness direction.

9. The display panel of claim 1, wherein the barrier part is spaced a predetermined distance from the lower display substrate.

10. The display panel of claim 1, wherein at least a portion of the second light control layer contacts the lower display substrate.

11. The display panel of claim 10, wherein the lower display substrate comprises:
a lower base substrate;
a display element layer on the lower base substrate and comprising the display elements; and
a cover layer configured to cover the display element layer,
wherein the second light control layer contacts the cover layer.

12. The display panel of claim 1, wherein the second light control layer is a light blocking layer configured to absorb the first color light.

13. The display panel of claim 1, further comprising a color filter layer between the base substrate and the first light control layer.

14. The display panel of claim 13, wherein the pixel areas comprise first to third pixel areas that are arranged in one direction, and
the color filter layer comprises:
a first color filter overlapping the first pixel area and configured to transmit second color light different from the first color light;
a second color filter overlapping the second pixel area and configured to transmit third color light different from the second color light; and
a third color filter overlapping the third pixel area and configured to transmit the first color light,
wherein the third color filter comprises a filter portion overlapping the third pixel area and a light blocking portion overlapping the light blocking area.

15. The display panel of claim 1, further comprising an adhesion member overlapping the non-display area and between the upper display substrate and the lower display substrate to define an inner space together with the upper display substrate and the lower display substrate,
wherein the display panel further comprises a filler in the inner space.

16. A display panel comprising:
an upper display substrate comprising a display area and a non-display area adjacent to the display area, wherein the display area comprises a plurality of pixel areas and a light blocking area adjacent to the pixel areas; and
a lower display substrate that faces the upper display substrate to emit first color light, the lower display substrate comprising a plurality of display elements respectively overlapping the pixel areas,
wherein the upper display substrate comprises:
a base substrate;
a first light control layer on the base substrate to control the first color light;
a capping layer comprising an absorption part overlapping the display area and being on the first light control layer and a barrier part overlapping the light blocking area and protruding from the absorption part in a direction away from the first light control layer in a thickness direction of the base substrate; and
a second light control layer on the barrier part,
wherein the second light control layer is a reflection layer comprising a metal material configured to reflect the first color light.

17. The display panel of claim 16, wherein the reflection layer is on an entire outer surface of the barrier part.

18. The display panel of claim 16, wherein the barrier part comprises first and second outer surfaces facing each other and connected to the absorption part and a bottom surface configured to connect the first outer surface to the second outer surface, and the reflection layer is on the first outer surface and the second outer surface.

19. The display panel of claim 18, wherein the bottom surface of the barrier part is exposed from the second light control layer to face the lower display substrate.

20. A display panel comprising:
an upper display substrate comprising a display area and a non-display area adjacent to the display area, wherein the display area comprises a plurality of pixel areas and a light blocking area adjacent to the pixel areas; and
a lower display substrate that faces the upper display substrate to emit first color light, the lower display substrate comprising a plurality of display elements respectively overlapping the pixel areas,
wherein the upper display substrate comprises:
a base substrate;
a first light control layer on the base substrate to control the first color light;
a capping layer comprising an absorption part overlapping the display area and being on the first light control layer and a barrier part overlapping the light blocking area and protruding from the absorption part in a direction away from the first light control layer in a thickness direction of the base substrate; and
a second light control layer on the barrier part,
wherein the light blocking layer is disposed on an entire outer surface of the barrier part.

* * * * *